United States Patent
Meng (10) Patent No.: US 6,418,040 B1
(45) Date of Patent: Jul. 9, 2002

(54) BI-DIRECTIONAL ARCHITECTURE FOR A HIGH-VOLTAGE CROSS-COUPLED CHARGE PUMP

(75) Inventor: Anita Meng, Milpitas, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/828,772

(22) Filed: Apr. 9, 2001

(51) Int. Cl.[7] ............................. H02M 3/18; H02M 7/00
(52) U.S. Cl. ............................ 363/60; 363/63; 307/109; 307/110
(58) Field of Search ............................. 363/63, 59, 60; 307/110, 109

(56) References Cited

U.S. PATENT DOCUMENTS

| | | | | |
|---|---|---|---|---|
| 4,982,318 A | * | 1/1991 | Maeba et al. ................. | 363/63 |
| 5,262,934 A | * | 11/1993 | Price ............................ | 363/63 |
| 5,999,426 A | * | 12/1999 | Meier et al. .................. | 363/63 |
| 6,184,741 B1 | * | 2/2001 | Ghilardelli et al. ......... | 327/536 |

OTHER PUBLICATIONS

Dickson, J.F., "On–Chip High–Voltage Generation in MNOS Integrated Circuites Using an Improved Voltage Multiplier Technique", IEEE J. of Solid–State Cir., vol. SC–II, No. 3, Jun. 1976, pp. 374–378.

Meng, Anita, "Switched Well Technique for Biasing Cross-–Coupled Switches or Drivers", U.S. Ser. No. 09/723,494, filed Nov. 28, 2000.

Meng, Anita, "Low Voltage Supply Higher Efficiency Cross-–Coupled High Voltage Charge Pumps", U.S. Ser. No. 09/764,693, filed Jan. 18, 2001.

* cited by examiner

Primary Examiner—Bao Q. Vu
(74) Attorney, Agent, or Firm—Christopher P. Maiorana, P.C.; Thomas W. Saur (57) ABSTRACT

An apparatus comprising a circuit configured to generate an output voltage having a magnitude greater than a supply voltage, where the output voltage is (i) a positive high voltage when a first input is in a first state and a second input is in a second state and (ii) a negative high voltage when the first input is in the second state and the second input is in the first state.

20 Claims, 6 Drawing Sheets

FIG. 1
(CONVENTIONAL)

FIG. 8

BI-DIRECTIONAL ARCHITECTURE FOR A HIGH-VOLTAGE CROSS-COUPLED CHARGE PUMP

FIELD OF THE INVENTION

The present invention relates to a method and/or architecture for charge pumps generally and, more particularly, to a method and/or architecture for a bi-directional, high-voltage, cross-coupled charge pump.

BACKGROUND OF THE INVENTION

Programming or erasing a non-volatile memory array usually requires high voltages. The value of the high voltages depends on the type of technology used to implement the non-volatile memory. The high voltage can be a positive high voltage, a negative high voltage, or both. For example, silicon, oxynitride, oxysilicon (SONOS) technology requires a high positive voltage (typically 9V to 10V) to program SONOS memory cells and a high negative voltage (typically −9V to −10V) to erase SONOS memory cells. Charge pump circuits are typically implemented in memory circuit designs to generate the required program and erase high voltages.

Figure 1:
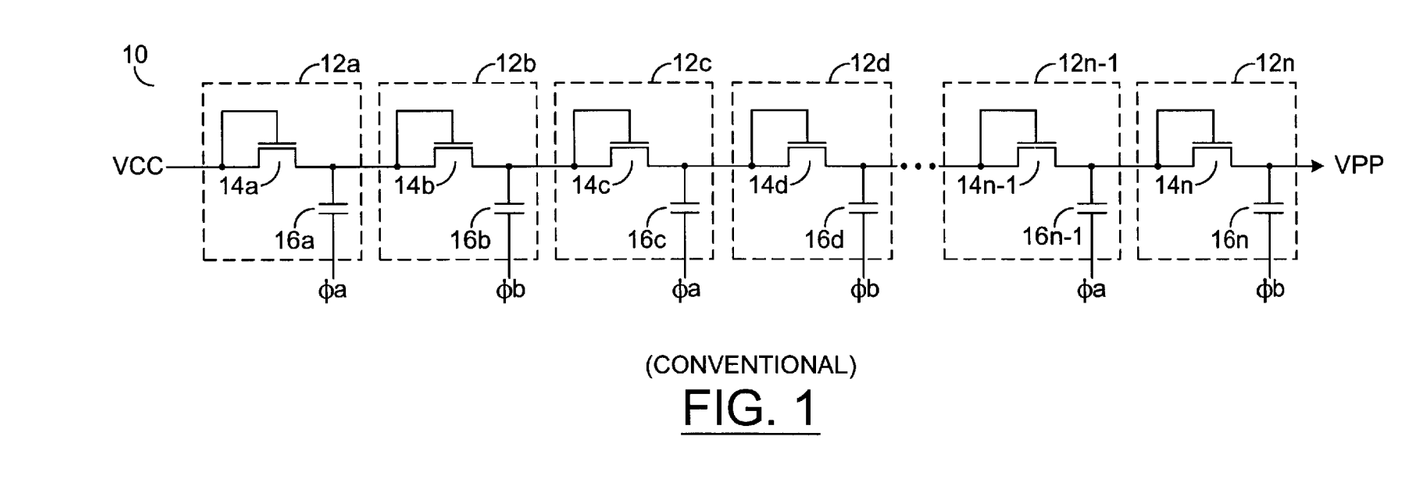
FIG. 1 is a diagram illustrating a conventional charge pump circuit.

Referring to FIG. 1, a diagram of a circuit 10 illustrating a conventional charge pump is shown. The circuit 10 illustrates a so-called Dickson charge pump circuit (see J. F. Dickson, "On-Chip High-Voltage Generation in MNOS Integrated Circuits Using an Improved Voltage Multiplier Technique", IEEE J. of Solid-state Cir., vol SC-11, No. 3, June, 1976, pp. 374–378, which is hereby incorporated by reference in its entirety). The circuit 10 includes a number of stages 12a–12n. Each stage 12 contains a diode connected transistor 14 and a capacitor 16.

The circuit 10 can provide a supply voltage minus threshold voltage (Vcc−Vtn) increase at each stage. The output voltage Vpp of the circuit 10 can be Vpp=approximately (Vcc−Vtn)*n+Vcc. The circuit 10 is shown implemented using a positive input voltage Vcc and NMOS transistors 14a–14n. The circuit 10 generates a positive voltage Vpp. However, the circuit 10 can be implemented using a negative input voltage and PMOS transistors to generate a negative output voltage Vpp.

For technologies requiring both positive and negative high voltages to program and/or erase the non-volatile memories (i.e., SONOS technology), the conventional methodology is to provide two separate high voltage charge pumps: a first to provide the high positive voltage and a second to provide the high negative voltage. The conventional charge pump designs for programming and erasing the non-volatile memories have the disadvantages that (i) two charge pump circuits require significant die area (twice the area of a single charge pump) and (ii) each charge pump is only used approximately 50% of the time since programming and erasing do not occur simultaneously.

It would be desirable to have a method and/or architecture for generating both positive and negative high voltages using a single charge pump circuit.

SUMMARY OF THE INVENTION

The present invention concerns an apparatus comprising a circuit configured to generate an output voltage having a magnitude greater than a supply voltage, where the output voltage is (i) a positive high voltage when a first input is in a first state and a second input is in a second state and (ii) a negative high voltage when the first input is in the second state and the second input is in the first state.

The objects, features and advantages of the present invention include providing a bi-directional architecture for a high-voltage, cross-coupled charge pump that may (i) generate either a high positive output voltage or a high negative output voltage, (ii) have reduced charge pump die area, (iii) minimize body effect, (iv) improve efficiency, (v) perform well at low supply voltages, (vi) perform well with supply voltages greater than threshold voltages (VCC>Vtn), (vii) require fewer pump stages than a conventional design, (viii) reduce the need for pump transistors having higher breakdown voltage, (ix) eliminate diode drop at the output stage, (x) be implemented using small pump switch transistors, (xi) have reduced capacitor load, and/or (xii) be implemented with a variety of high voltage charge pump designs.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 2:
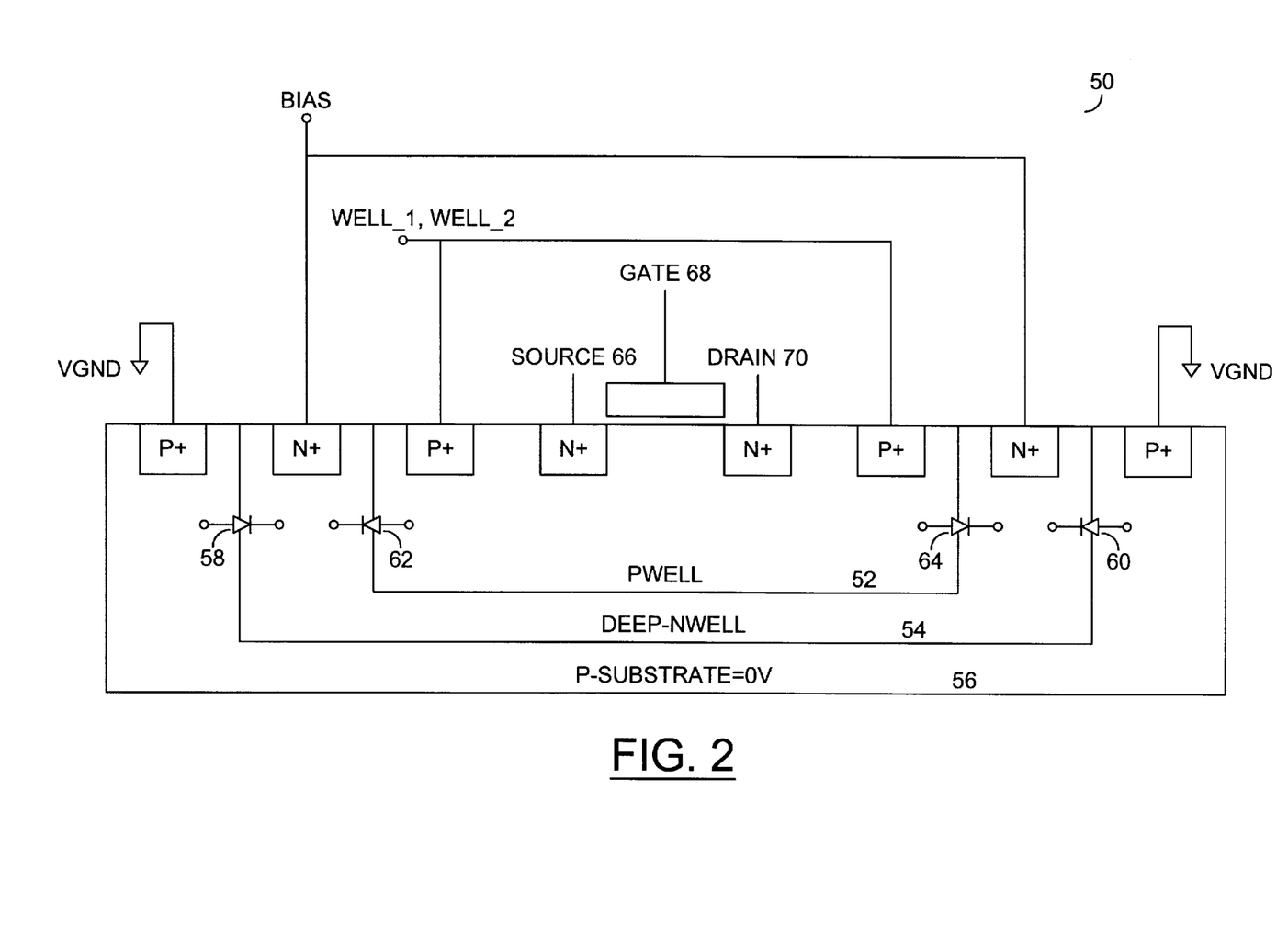
FIG. 2 is a diagram illustrating a deep N-well NMOS transistor.

Referring to FIG. 2, a diagram illustrating a cross-section of a deep N-well NMOS transistor 50 is shown. The transistor 50 may have a P-well region 52 that may receive a bias signal (e.g., WELL_1 and WELL_2), a deep N-well region 54 that may receive a bias signal (e.g., BIAS), and a P-substrate region 56 that may be connected to a voltage supply ground potential (e.g., VGND). Junctions between the deep N-well region 54 and the P-substrate region 56 may form parasitic diodes 58 and 60. Junctions between the P-well region 52 and the deep N-well region 54 may form parasitic diodes 62 and 64. The transistor 50 may have a source 66, a gate 68, and a drain 70. The diodes 58, 60, 62 and 64 are generally reverse biased.

When negative voltage potentials are presented to the source 66, the gate 68 and the drain 70 of the transistor 50, the P-well region 52 generally must be biased (e.g., the signals WELL_1 and WELL_2 must have values) to the lower of the source 66 voltage and the drain 70 voltage. To prevent forward bias of the P-well region 52 to the deep N-well region 54, the signal BIAS may be implemented as a constant positive voltage. For example, when a supply voltage (e.g., VCC) is 2V, the signal BIAS may have a voltage level in the range 0.5V to VCC. In one example, the signal BIAS may be 500 mV.

The P-substrate region 56 may be connected to the ground potential VGND. The bias at the deep N-well region 54 (e.g., the signal BIAS) may be greater than the bias at the P-well region 52 (e.g., the signals WELL_1 and WELL_2). The bias at the P-well region 52 (e.g., the signals WELL_1 and WELL_2) will generally have a negative value. The signal BIAS may be greater than the bias at the P-substrate region 56 (e.g., VGND or 0V).

When positive voltage potentials are presented to the source 66, the gate 68 and the drain 70 of the transistor 50, the P-well 52 generally must be biased (e.g., the signals WELL_1 and WELL_2 must have values) to the lower of the voltages presented to the source 66 and the drain 70. Biasing with the lower of the two voltages generally prevents forward bias of the junction between the source 66 or the drain 70 and the P-well region 52. The diodes 62 and 64 generally must be reverse biased during all operating conditions. To ensure the diodes 62 and 64 are reverse biased, the deep N-well region 54 is generally biased to a voltage (e.g., the signal BIAS) that is higher than the P-well region 52. In one example, the deep N-well region 54 may be biased to the higher of the positive voltages presented to the source 66 or the drain 70. The signal BIAS may be greater than the signals WELL_1 and WELL_2.

The signal BIAS may be greater than the bias at the P-substrate region 56 (e.g., VGND or 0V).

Figure 3:
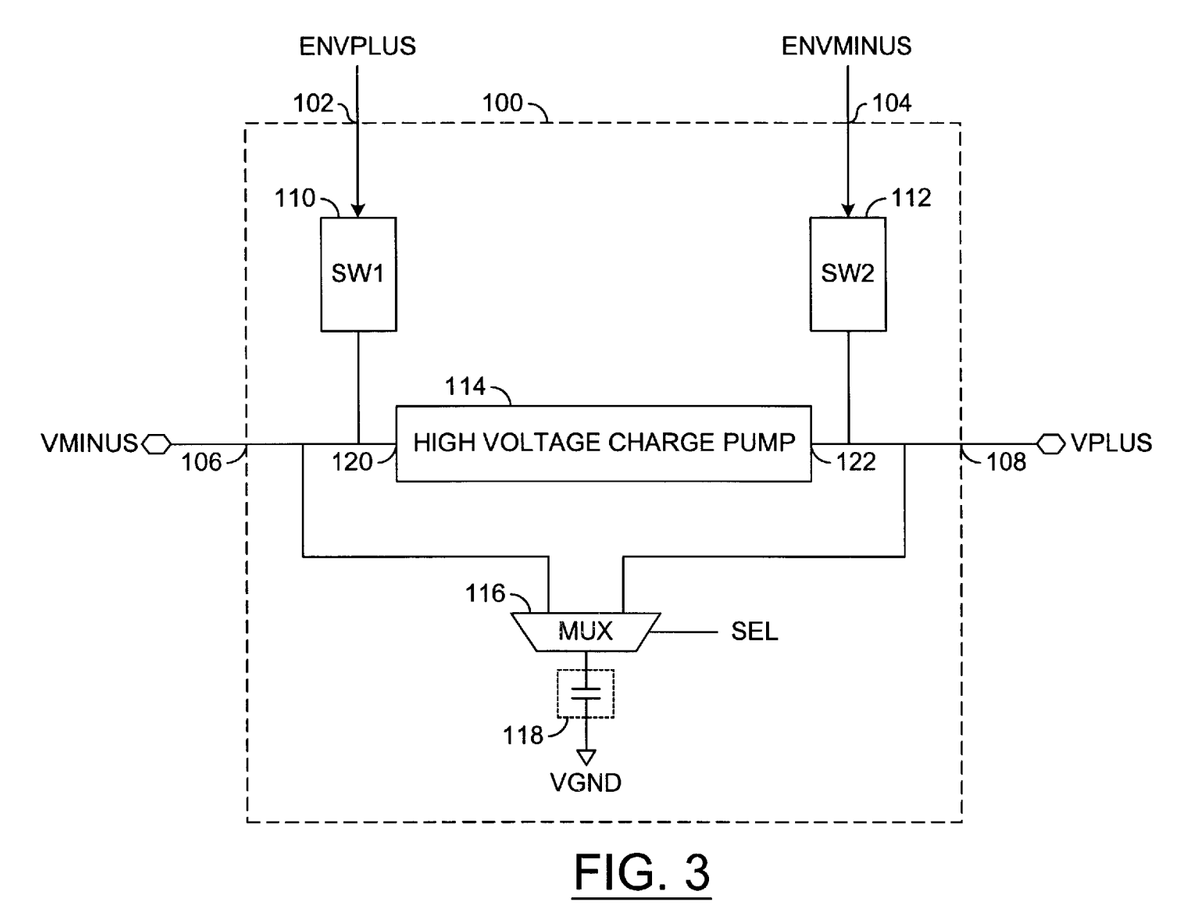
FIG. 3 is a diagram illustrating a preferred embodiment of the present invention.

Referring to FIG. 3, a block diagram of a circuit 100 illustrating a preferred embodiment of the present invention is shown. The circuit 100 may be a bi-directional, high voltage, cross-coupled charge pump circuit. The circuit 100 may be configured to generate an output voltage having a magnitude greater than a supply voltage, where the output voltage is (i) a positive high voltage when a first input is in a first state and a second input is in a second state and (ii) a negative high voltage when the first input is in the second state and the second input is in the first state. The circuit 100 may have an input 102 that may receive a signal (e.g. ENVPLUS), an input 104 that may receive a signal (e.g., ENVMINUS), an input/output 106 that may present a signal (e.g., VMINUS), and an input/output 108 that may present a signal (e.g., VPLUS). The signals ENVPLUS and ENVMINUS may be control signals. The signals ENVPLUS and ENVMINUS may be generated in response to either a supply voltage (e.g., VPWR) or the ground potential VGND to set the mode of operation of the circuit 100. In one example, the signals ENVPLUS and ENVMINUS may be generated by additional control logic and/or programmable logic (not shown).

The circuit 100 may comprise, in one example, a circuit 110, a circuit 112, a circuit 114, a circuit 116, and a circuit 118. The circuits 110 and 112 may be implemented as switch circuits. The circuit 114 may be a high voltage charge pump circuit. The circuit 114 may be configured to generate either a positive high voltage charge pump or a negative high voltage charge pump signal. In one example, the circuit 114 may be implemented as a cross-coupled charge pump circuit using P-well biased deep N-well NMOS transistors similar to the transistor 50. The circuit 100 may be implemented using any suitable transistor technologies (e.g., silicon, oxynitride, oxysilicon (SONOS) technology). However, any type of high voltage charge pump circuit may be used to meet the design criteria of a particular application as long as the pump devices are biased in accordance with the teachings of present invention. The circuit 116 may be implemented as a multiplexer circuit. The circuit 118 may be implemented as a load.

The circuit 110 may have an input that may receive the signal ENVPLUS and an output that may be connected to an input/output 120 of the circuit 114. The circuit 112 may have an input that may receive the signal ENVMINUS and an output that may be connected to an input/output 122 of the circuit 114. Depending on the mode of operation of the circuit 100, the input/output 120 may (i) be configured as an input clamped at the supply voltage VPWR or (ii) configured as an output that may present the signal VMINUS. Depending on the mode of operation of the circuit 100, the input/output 122 may (i) be configured as an input clamped at the ground potential VGND or (ii) configured as an output that may present the signal VPLUS.

The circuit 116 may have a first input that may be connected to the input/output 120, a second input that may be connected to the input/output 122, a control input that may receive a signal (e.g., SEL), and an output that may be connected to a first terminal of the circuit 118. The circuit 118 may have a second terminal that may be connected to the ground potential VGND. The circuit 118 may comprise a capacitance coupled between the first terminal and the second terminal. The circuit 116 may be configured to couple the circuit 118 between either the input/output 120 or the input/output 122 and the ground potential VGND in response to the signal SEL.

During an example operation, the circuit 100 may be configured as a positive high voltage charge pump circuit. The signal ENVPLUS may be asserted as the supply voltage VPWR. The signal ENVMINUS may be asserted as the ground potential VGND. The circuit 100 may be configured to generate the signal VPLUS as a high positive output voltage in response to the configuration of the circuit 110 and the circuit 112. In one example, the signal ENVPLUS may be asserted. The circuit 110 may be enabled. The signal VMINUS may be forced to a fixed voltage level (e.g., the supply voltage VPWR) via the circuit 110. Simultaneously, the signal ENVMINUS may be deasserted. The circuit 112 may be off. The input/output 108 may be configured as an output. The signal SEL may be asserted such that the input/output 122 is coupled to the load 118. The circuit 100 may present the signal VPLUS as a positive high voltage output.

During another example operation, the circuit 100 may be configured as a negative high voltage charge pump circuit. The signal ENVMINUS may be asserted as the supply voltage VPWR. The signal ENPLUS may be asserted as the ground potential VGND. The circuit 100 may be configured to generate the signal VMINUS as a high magnitude negative output voltage in response to the configuration of the circuits 110 and 112. When the signal ENVMINUS is asserted, the circuit 112 may be enabled. The signal VPLUS may be forced to a fixed voltage (e.g., the ground potential VGND). Simultaneously, the signal ENVPLUS may be deasserted. The circuit 110 may be disabled. The input/output 106 may be configured as an output. The signal SEL may be asserted such that the input/output 120 is coupled to the load 118. The circuit 100 may present the signal VMINUS as a negative high voltage output.

Figure 4:
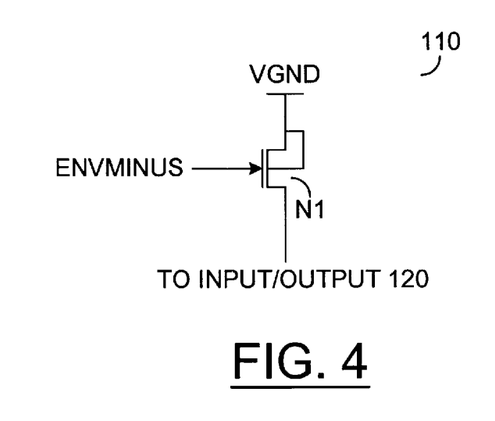
FIG. 4 is a diagram illustrating an implementation of a switch circuit of FIG. 3.

Referring to FIG. 4, a schematic diagram illustrating an implementation of the circuit 110 of FIG. 3 is shown. In one example, the circuit 110 may comprise a transistor N1. The transistor N1 may be implemented as one or more NMOS transistors. However, other transistors or polarities or any suitable switch circuit may be implemented to meet the design criteria of a particular application. The transistor N1 may have a source that may receive the ground potential VGND, a gate that may receive the signal ENVMINUS, a P-well that may be connected to the source, and a drain that may be connected to the input/output 120 of the circuit 114.

Figure 5:
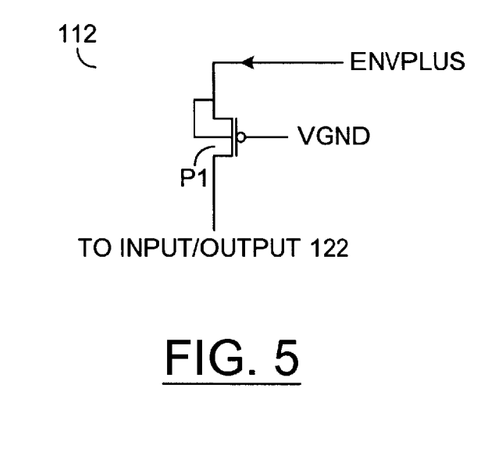
FIG. 5 is a diagram illustrating another implementation of a switch circuit of FIG. 3.

Referring to FIG. 5, a diagram illustrating an implementation of the circuit 112 of FIG. 3 is shown. In one example, the circuit 112 may comprise a transistor P1. The transistor P1 may be implemented as one or more PMOS transistors. However, other transistors or polarities or any suitable switch circuit may be implemented to meet the design criteria of a particular application. The transistor P1 may have a source that may receive the signal ENVPLUS, a gate that may receive the ground potential VGND, an N-well that may be connected to the source, and a drain that may be connected to the input/output 122 of the circuit 114.

Figure 6:
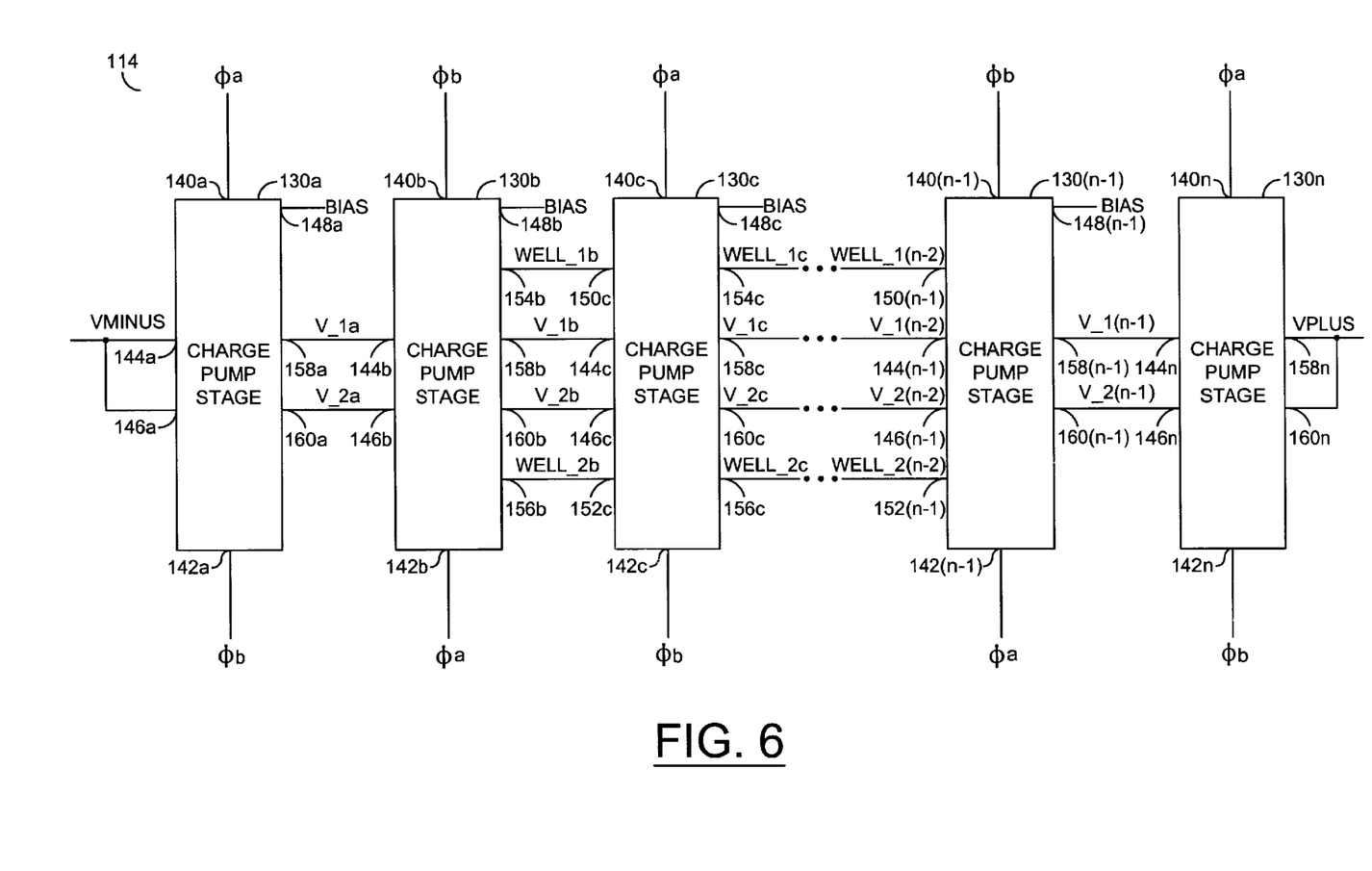
FIG. 6 is a block diagram illustrating a charge pump circuit in accordance with a preferred embodiment of the present invention.

Referring to FIG. 6, a detailed block diagram illustrating the circuit 114 is shown. In one example, the circuit 114 may comprise a number of circuits or stages 130a–130n. The stages 130a–130n may be implemented as charge pump stages. In one example, the stages 130a–130(n−1) may be implemented similarly to the P-well biased, deep N-well cross-coupled charge pump stages as described in co-pending application U.S. Ser. No. 09/794,693, filed Jan. 18, 2001, which is hereby incorporated by reference in its entirety. However, any suitable charge pump stage and/or stages may be implemented accordingly to meet the design criteria of a particular application.

In one example, the stage 130n may be implemented similarly to the cross-coupled driver circuit described in co-pending application U.S. Ser. No. 09/723,494, filed Nov. 28, 2000, which is hereby incorporated by reference in its entirety. However, any suitable output driver circuit (e.g., a bootstrapped driver circuit, etc.) may be implemented accordingly to meet the design criteria of a particular application.

Where a stage 130i is any one of the stages 130a–130(n−1), the stage 130i may, in one example, have an input 140i that may receive the either a first signal (e.g., φa) or a second signal (e.g., φb), an input 142i may receive the alternate of the signals φa or φb presented to the input 140i, an input/output 144i that may receive a signal (e.g., V_1(i−1)), an input/output 146i that may receive a signal (e.g., V_2(i+1)), an input 148i that may receive the signal BIAS, an input 150i that may receive the signal WELL_1(i−1), an input 152i that may receive the signal WELL_2(i+1), an output 154i that may present the signal WELL_1i, an output 156i that may present the signal WELL_2i, an input/output 158i may present the signal V_1i, and an input/output 160i may present the signal V_2i. In another example, the input/output 144i may present signal V_1i, the input/output 146i may present the signal V_2i, the input/output 158i may receive the signal V_1(i+1), and the input/output 160i may receive the signal V_2(i+1).

The signals φa and φb may be alternated between the inputs 140a–140n and 142a–142n of the stages 130a–130n (e.g., the inputs 140a, 140c, 140e, etc., and the inputs 142b, 142d, 142f, etc., may receive the signal φa, and the inputs 140b, 140d, 140f, etc., and the inputs 142a, 142c, 142e, etc., may receive the signal φb). Alternatively, the signals φa and φb may be exchanged. The signals φa and φb may be, in one example, non-overlapping complementary clock signals. The amplitude of the signals φa and φb may be similar to the amplitude of the supply voltage VPWR (e.g., the signals φa and φb may swing from rail to rail).

The signals V_1i and V_2i may be output voltages in one configuration. The voltage of the output signals V_1i and V_2i will generally be approximately VPWR * (i+1), where i is the number of the stage. Alternatively, the signals V_1i and V_2i may be approximated with losses as (VPWR * (Cpump/(Cpump+Cpara))−Iload/(f * (Cpump+Cpara))), where Cpump=pump stage 130 capacitance, Cpara=total parasitic capacitance at each pump stage 130, Iload=output load current (leakage current), and f=the frequency of the clock signals φa and φb. The signals WELL_1i and WELL_2i are generally presented by the stage 130i left-to-right to the stage 130(i+1).

The stage 130a may have an input/output 144a and an input/output 146a that may be connected together to form a node. The signal VMINUS may be presented at the node formed by the input/outputs 144a and 146a. The stage 130a may be implemented with a self-biased P-well and an externally biased deep N-well, biased by the signal BIAS.

The stage 130n may have an input/output 158n and an input/output 160n that may be connected together to form a node. The signal VPLUS may be presented at the node formed by the input/outputs 158n and 160n. The stage 130n may be self-biasing.

Figure 7:
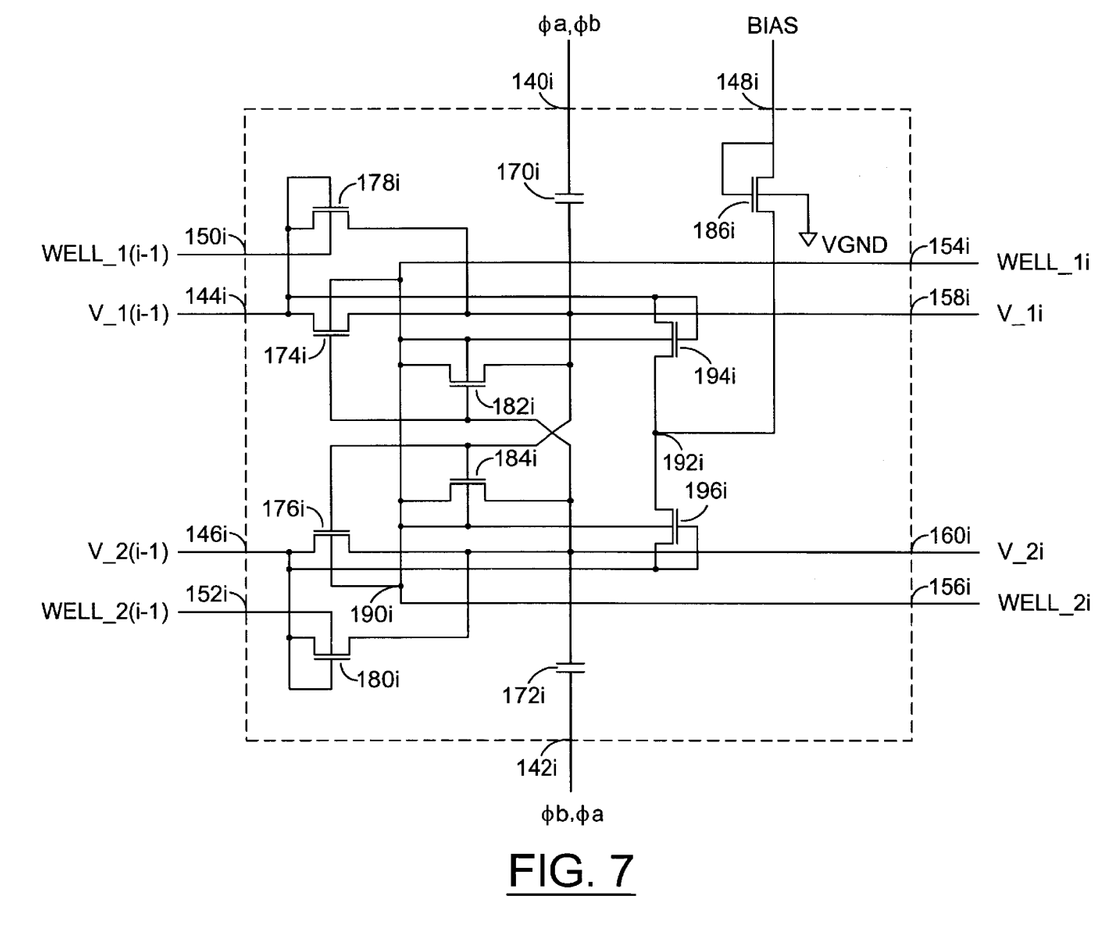
FIG. 7 is a diagram illustrating an implementation of a charge pump stage of FIG. 6.

Referring to FIG. 7, a schematic diagram of a circuit 130i illustrating an example implementation of a charge pump stage of FIG. 6 is shown. In one example, the stage 130i may comprise a device 170i, a device 172i, a transistor 174i, a transistor 176i, a transistor 178i, a transistor 180i, a transistor 182i, a transistor 184i, a transistor 186i, a node 190i, a node 192i, a transistor 194i, and a transistor 196i. The devices 170i and 172i may be implemented as, in one example, capacitors. Alternatively, the devices 170i and 172i may be implemented as transistors configured as capacitors. The transistors 174i, 176i, 178i, 180i, 182i, 184i, 186i, 194i, and 196i may be implemented as one or more NMOS transistors. In a preferred embodiment, the transistors 174i, 176i, 178i, 180i, 182i, 184i, 194i, and 196i may be implemented as one or more deep N-well NMOS transistors similar to the transistor 50 of FIG. 2. The transistors 174i and 176i may be cross-coupled (e.g., a gate of one transistor is connected to a drain of the other transistor). The transistors 182i and 184i may be cross-coupled.

The node 190i may be the P-well region of the transistors 174i, 176i, 182i, 184i, 194i, and 196i. The node 190i may correspond to the P-well region 52 of the transistor 50 as described in connection with FIG. 2. The node 192i may be the deep N-well region of the transistors 174i, 176i, 178i, 180i, 182i, 184i, 194i, and 196i. The node 192i may correspond to the deep N-well region 54 of FIG. 2. The deep N-well node 192i may be biased at each pump stage 130i separately. The P-substrates of the transistors 174i, 176i, 182i, 184i, 194i, and 196i may be connected to the ground potential VGND.

The signal φa may be presented to a first terminal of the device 170i. The signal V_1i may be presented at a node formed by the connection of a second terminal of the device 170i, a source of the transistor 174i, a gate of the transistor 176i, a source of the transistor 178i, a source of the transistor 182i, and a gate of the transistor 184i. The signal φb may be presented to a first terminal of the device 172i. The signal V_2i may be presented at a node formed by the connection of a second terminal of the device 172i, a gate of the transistor 174i, a source of the transistor 176i, a source of the transistor 180i, a gate of the transistor 182i, and a source of the transistor 184i.

The signal V_1(i−1) may be presented to a drain of the transistor 174i, a gate and a drain of the transistor 178i, and a gate and a drain of 194i. The signal V_2(i−1) may be presented to a drain of the transistor 176i, a gate and a drain of the transistor 180i, and a gate and a drain of 196i. The signal BIAS may be presented to a drain and a gate of the transistor 186i. The transistor 186i may have a P-well terminal that may be connected to the ground potential VGND and a source that may be connected to the node 192$i$. The transistors 194$i$ and 196$i$ may have sources that may be connected to the node 192$i$. The transistors 186$i$, 194$i$, and 196$i$ may be configured as a diodes. The transistors 186$i$, 194$i$, and 196$i$ may be implemented as one or more NMOS transistors. However, other polarities and/or types of transistors may be implemented to meet the design criteria of a particular application.

In one example, the signals WELL_1$i$ and WELL_2$i$ may be combined to form a single signal. The combination of the signals WELL_1$i$ and WELL_2$i$ may be presented at a node formed by the connection of a P-well of the transistor 174$i$, a P-well of the transistor 176$i$, a drain and a P-well of the transistor 182$i$, a drain and a P-well of the transistor 184$i$, a P-well of the transistor 194$i$, a P-well of the transistor 196$i$, a P-well of the transistor 178($i$+1), and a P-well of the transistor 180($i$+1) (e.g., the node 190$i$).

The transistors 174$i$ and 176$i$ may be configured as cross-coupled drivers. The transistors 178$i$ and 180$i$ may be configured as diodes. The transistors 178$i$ and 180$i$ may be sized smaller than the transistors 174$i$ and 176$i$. For example, the transistors 178$i$ and 180$i$ may have a width 25% to 33% of the width of the transistors 174$i$ and 176$i$. The transistors 178$i$ and 180$i$ may aid the ramp up and ramp down processes of the circuit 100. The transistors 178$i$ and 180$i$ may be configured to (i) set up the initial conditions and (ii) provide a final discharge path of the circuit 100. The transistors 182$i$ and 184$i$ may be sized smaller than the transistors 174$i$ and 176$i$. In one example, the transistors 182$i$ and 184$i$ may be in the range of 20% to 40% as large as the transistors 174$i$ and 176$i$. The transistors 182$i$ and 184$i$ may be configured to provide P-well biasing (e.g., the signals WELL_1$i$ and WELL_2$i$, respectively) to the transistors 174$i$, 176$i$, 178($i$+1), 180($i$+1), 182$i$, 184$i$, 194$i$, and 196$i$. The transistors 194$i$ and 196$i$ may be sized smaller than the transistors 174$i$ and 176$i$. In one example, the transistors 194$i$ and 196$i$ may be in the range of 30% to 40% as large as the transistors 174$i$ and 176$i$. The transistors 186$i$, 194$i$, and 196$i$ may be configured to provide biasing (e.g., the signal BIAS) to the deep N-well node 192$i$. In one example, the transistor 186$i$ may be configured as a switch circuit that may present the signal BIAS to the deep N-well node 192$i$.

Figure 8:
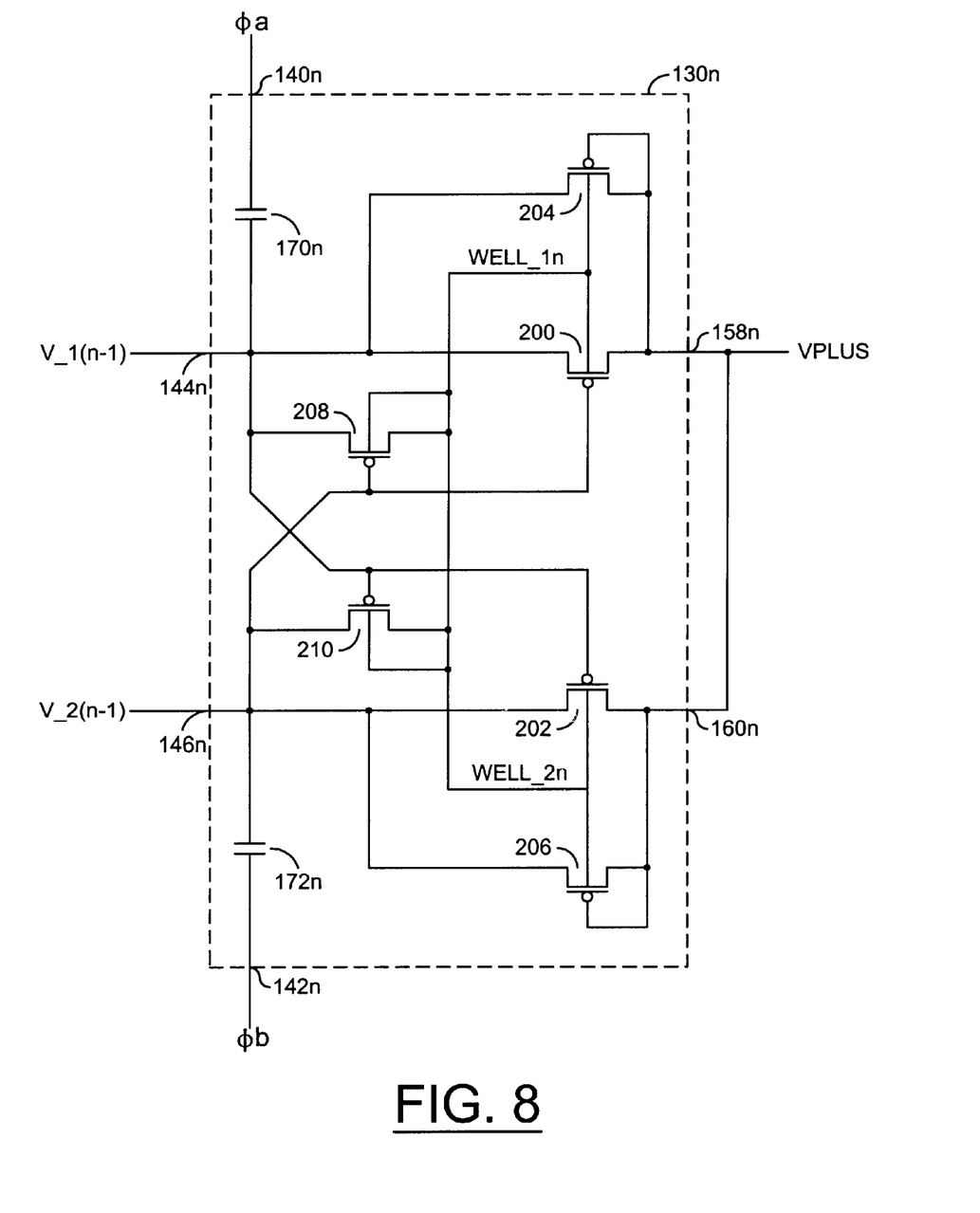
FIG. 8 is a diagram illustrating an alternative implementation charge pump stage of FIG. 6.

Referring to FIG. 8, a schematic diagram illustrating an example implementation of the stage 130$n$ is shown. The stage 130$n$ may comprise, in one example, the device 170$n$, the device 172$n$, a transistor 200, a transistor 202, a transistor 204, a transistor 206, a transistor 208, and a transistor 210. The devices 170$n$ and 172$n$ may be implemented as, in one example, capacitors. Alternatively, the devices 170$n$ and 172$n$ may be implemented as transistors configured as capacitors. The transistors 200, 202, 204, 206, 208, and 210 may be implemented as one or more PMOS transistors having N-well biasing. However, other types and polarities of transistors may be implemented accordingly to meet the design criteria of a particular application. The transistors 200 and 202 may be cross-coupled. The transistors 208 and 210 may be cross-coupled.

The signal φa may be presented to a first terminal of the device 170$n$. The signal V_1($n$−1) may be presented to a node formed by the connection of a second terminal of the device 170$n$, a source of the transistor 200, a gate of the transistor 202, a source of the transistor 204, a source of the transistor 208, and a gate of the transistor 210. The signal φb may be presented to a first terminal of the device 172$n$. The signal V_2($n$−1) may be presented to a node formed by the connection of a second terminal of the device 172$n$, a gate of the transistor 200, a source of the transistor 202, a source of the transistor 206, a gate of the transistor 208, and a source of the transistor 210. The signal VPLUS may be presented at a node formed by the connection of a drain of the transistor 200, a drain of the transistor 202, a gate and a drain of the transistor 204, and a gate and a drain of the transistor 206. A node may be formed by the connection of N-wells of the transistors 200, 202, 204, 206, 208, and 210 and a drain of the transistors 208 and 210.

The transistors 200 and 202 may be configured as cross-coupled drivers. The transistors 204 and 206 may be configured as diodes. The transistors 204 and 206 may be sized smaller than the transistors 200 and 202. For example, the transistors 204 and 206 may have a width 25% to 33% of the width of the transistors 200 and 202. The transistors 204 and 206 may aid the ramp up and ramp down processes of the circuit 100. The transistors 204 and 206 may be configured to (i) set up the initial conditions and (ii) provide a final discharge path of the circuit 100. The transistors 208 and 210 may be sized smaller than the transistors 200 and 202. In one example, the transistors 208 and 210 may be in the range of 20% to 40% as large as the transistors 200 and 202. The transistors 208 and 210 may be configured to provide N-well biasing to the transistors 200, 202, 204, 206, 208, and 210.

The stage 130$n$ may eliminate Vt drop when the circuit 100 is configured as a high positive voltage charge pump. Operation of the stage 130$n$ may be similar to the operation of the output stages of the circuits described in co-pending applications U.S. Ser. No. 09/723,494, filed Nov. 28, 2000 and U.S. Ser. No. 09/794,693, filed Jan. 18, 2001. The N-well biasing of the transistors 200 and 202 of the circuit 130$n$ may be implemented similarly to the P-well biasing of the transistors 174$i$ and 176$i$ of the stage 130$i$. The signals WELL_1$n$ and WELL_2$n$ (or a combination thereof) may be at highest voltage potential of the signal V_1($n$−1) or the signal V_2($n$−1). When the circuit 100 is operated as a high magnitude negative charge pump, the stage 130$n$ may be implemented as the first pump stage. The transistors 208 and 210 may bias the N-wells of the transistors 200, 202, 204, 206, 208, and 210 to the higher of the signals V_1($n$−1) and V_2($n$−1). The higher voltage of the signals V_1($n$−1) and V_2($n$−1) may be 0V or slightly above 0V (e.g., 0.5V).

The transistors 178$i$ and 180$i$ may provide natural bias even when the circuit 100 is not turned on. The transistors 178$i$ and 180$i$ may prevent charge build-up at any of the stages 130$a$–130$n$. The transistors 178$i$ and 180$i$ may provide an initial bias to the transistors 174$i$ and 176$i$, as well as a discharge path for each stage 130$i$. During a pumping operation of the circuit 100, the transistors 178$i$ and 180$i$ are generally off. The transistors 174$i$ and 176$i$ may be switched on and off alternately in every cycle of the clock signals φa and φb.

During one example operation, the circuit 100 may be operated as a positive charge pump (e.g., the signal ENVPLUS may be asserted as the supply voltage VPWR and signal ENVMINUS may be asserted as the ground potential VGND). Charge may be pumped up from left-to-right (e.g., from the stage 130$a$ to the stage 130$n$).

At any stage 130$i$, the input/outputs 144$i$, 146$i$, 158$i$, and 160$i$, the inputs 150$i$ and 152$i$, and the outputs 154$i$ and 156$i$ may be at a positive voltage. The node 190$i$ may be biased to a positive voltage. The node 190$i$ is generally biased to the lowest voltage potential of the signals V_1($i$+1) and V_2($i$+1), alternately. The deep N-well node 192$i$ may be initially biased through diode transistor 186$i$ to a positive voltage level (e.g., VPWR−Vtn). The transistors 194i and 196i may initially be reverse biased. After successive cycles of the signals φa and φb, the signals V__1(i+1) and V__2(i+1) may have an amplitude greater than Vtn+(VPWR−Vtn). The transistors 194i and 196i may turn on. The deep N-well node 192i voltage may be the voltage level of the signal V__1(i+1)−Vtn or the voltage level of the signal V__2(i+1)−Vtn. When the signal V__1(i+1)−Vtn>>VPWR−Vtn, the transistor 186i is generally reverse biased (e.g., turned off).

At the stage 130i, when the signal φa is asserted HIGH (e.g., digital 1 or "on") at the input 140i, the transistor 176i may be turned on. Simultaneously, the transistors 176(i+1) and 176(i+1) of the previous stage 130(i+1) and the next stage 130(i+1), respectively, may be turned off by the signal φb. The signal φb may be deasserted or LOW (e.g., digital 0 or "off") at the input 142i. The transistor 174i may be turned off. Simultaneously, the transistors 174(i+1) and 174(i+1) of the previous stage 130(i+1) and the next stage 130(i+1), respectively, may be turned on by the signal φa. When the signal φa is asserted HIGH (e.g., the amplitude of the signal φa=VPWR), the signal V__1i will generally be at an amplitude Vx+VPWR, where Vx is the voltage level of the signal V__1i prior to the signal φa being asserted HIGH. Simultaneously, the signal φb may be deasserted (e.g., LOW) The signal V__2i will generally be at an amplitude Vy−VPWR, where Vy is the voltage level of the signal V__2i prior to the signal φb being deasserted.

When the transistor 176i is on, charge at the stage 130(i+1) may be pumped to the stage 130i through the transistor 176i. Similarly, when the signal φa is asserted HIGH, charge at the stage 130i may be pumped to the stage 130(i+1) through the transistor 174(i+1). The signals V__2i and V__1(i+1) may have an increased amplitude due to the charge being pumped through the transistors 176i and 174(i+1).

When the signal φa is deasserted (e.g., LOW) at the input 140i, the signal V__1i may be at a low amplitude (e.g., VPWR). However, the transistor 176i may be turned off. The charge stored at the stage 130i may not be discharged. Simultaneously, the signal φb may be asserted HIGH (e.g., the amplitude of the signal φb=VPWR). The signal V__2i may be at the amplitude Vx+VPWR. When the transistor 176(i+1) is on, charge at the stage 130i may be pumped to the stage 130(i+1).

When the circuit 100 is configured as positive charge pump, the signal BIAS may be a fixed positive DC voltage (e.g., VPWR). Initially the deep N-well node 192i may be at a positive voltage (e.g., VPRW−Vtn). During the charge pumping operation each stage 130i may be pumped to a successively higher voltage. When the amplitude of the signal V__1(i+1)>(Vtn+(VPWR−Vtn)), the transistors 194i and 196i may be turned on. The transistors 194i and 196i may charge the deep N-well node 192i to the amplitude of the signal V__1(i−1)−Vtn or, alternately, the amplitude of the signal V__2(i+1)−Vtn. The voltage at the deep N-well node 192i may be the amplitude of the signal V__1(i−1)−Vtn (e.g., VPWR−Vtn). The transistor 186i may be turned off (e.g., reverse biased).

During another example operation, the circuit 100 may be operated as a negative charge pump (e.g., the signal ENVPLUS may be asserted as the ground potential VGND and signal ENVMINUS may be asserted as the supply voltage VPWR). Charge may be pumped down from right-to-left (e.g., from the stage 130n to the stage 130a). The nodes 190a−190(n−1) may be biased to a negative voltage. The node 190i is generally biased to the lowest voltage potential of the signals V__1(i+1) and V__2(i+1), alternately. The deep N-well node 192i may be biased through the transistor 186i. In one example, the signal BIAS may be the supply voltage VPWR (e.g., 1.8V, etc.). The voltage at the deep N-well node 192i may be VPWR−Vtn. In another example, the signal BIAS may be a fixed positive voltage that will generally provide DC voltage at the deep N-well node 192i (e.g., +0.5V). Asserting a positive voltage at the deep N-well node 192i may prevent forward bias of parasitic junction diodes in the stage 130i similar to the parasitic diodes 58, 60, 62, and 64 of FIG. 2. When the deep N-well node 192i is biased with a positive voltage, the transistors 194i and 196i are generally reverse biased (e.g., turned off).

When the circuit 100 is operated as a negative charge pump, the pumping operation may be similar to the pumping operation when the circuit 100 is operated as a positive charge pump. However, left-hand side of the stages 130a−130n generally have lower voltage potential than the right-hand side. After successive cycles of the signals φa and φb, any positive charge at pump stages 130a−130n will generally be pumped to the ground potential VGND. The left side of each pump stage 130i will generally be pumped to a lower negative voltage potential than the right side (e.g., the input/output 144(i+1) may be at a lower voltage than the input/output 144i, etc.). The input/outputs 144a and 146a may be at the lowest negative voltage (e.g., VMINUS).

When the circuit 100 is configured as negative charge pump, the input/outputs 144i and 146i, the inputs 150i and 152i, is the outputs 154i and 156i, and the input/outputs 158i and 160i are generally at a negative voltage potential. However, for proper operation, the deep N-well node 192i is generally biased at a fixed positive voltage (e.g., +1.5V, VPRW, etc.). The transistor 186i may be conducting. The deep N-well node 192i may be at a positive DC voltage (e.g., 1.5V−Vth, VPWR−Vth, Vtn, etc.) When the deep N-well node 192i is biased at a positive voltage, the transistors 194i and 196i are generally reverse biased (e.g., turned off).

Forward bias of the parasitic junction diodes in the stage 130i is generally prevented by implementing the following biases: (i) the voltage at the deep N-well node 192i is generally the higher of the signal V__1(i−1)−Vtn or the signal V__2(i−1)−Vtn during the operation of the circuit 100 as a positive voltage charge pump, (ii) the voltage at the node 190i is generally the lower of the signal V__1(i+1) or the signal V__2(i−1) when the circuit 100 is operated as a negative voltage charge pump, and (iii) the P-substrates of the transistors 174i, 176i, 182i, 184i, 194i and 196i may be connected to the ground potential VGND.

When the difference between the amplitude of the signal V__1(i+1) for the signal φa asserted and for the signal φa deasserted is >>Vtn or when the difference between the amplitude of the signal V__2(i+1) for the signal φb asserted and for the signal φb deasserted is >>Vtn, the voltage at the node 192i is generally>the voltage at the node 190i. The voltage at the node 192i is generally>the ground potential VGND.

The various signals of the present invention are generally "on" (e.g., a digital HIGH, or 1) or "off" (e.g., a digital LOW, or 0). However the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a circuit configured to generate an output voltage having a magnitude greater than a supply voltage, wherein (a) said output voltage is (i) a positive high voltage when a first circuit input is in a first state and a second circuit input is in a second state and (ii) a negative high voltage when said first circuit input is in said second state and said second circuit input is in said first state, (b) said circuit comprises a plurality of serially connected charge pump stages and (c) each charge pump stage comprises (i) a first capacitor configured to receive a first signal, (ii) a second capacitor configured to receive a second signal, (iii) a first pump input coupled to a drain of a first transistor, and (iv) a second pump input coupled to a drain of a second transistor.

2. The apparatus according to claim 1, wherein said first state comprises coupling said first circuit input to a supply voltage and said second state comprises coupling said first circuit input to a ground potential.

3. The apparatus according to claim 1, wherein said output voltage is generated in response to a pair of complementary clock signals.

4. The apparatus according to claim 1, wherein a first and a last of said charge pump stages are configured to present said negative or said positive high voltage, respectively.

5. The apparatus according to claim 4, wherein one or more of said plurality of charge pump stages further comprise:
    said first capacitor configured to receive said first signal at a first terminal;
    said second capacitor configured to receive said second signal at said first terminal;
    a first output coupled to (i) a second terminal of said first capacitor, (ii) a source of said first transistor, and (iii) a gate of said second transistor; and
    a second output coupled to (i) a second terminal of said second capacitor, (ii) a source of said second transistor, and (iii) a gate of said first transistor.

6. The apparatus according to claim 5, wherein said first output is coupled to said first pump input of a next one of said plurality of pump stages and said second output is coupled to said second pump input of said next one of said plurality of pump stages.

7. The apparatus according to claim 6, wherein:
    said last of said plurality of pump stages presents said positive high voltage at a node formed by connecting a first pump terminal and a second pump terminal when a first of said plurality of pump stages receives said supply voltage at a third and a fourth pump terminals; and
    when said first of said plurality of pump stages receives a ground potential at said first pump terminal and said second pump terminal said first of said plurality of pump stages presents said a negative high voltage at a node formed by connecting said third and fourth pump terminals.

8. The apparatus according to claim 7, wherein said one or more pump stage further comprises:
    a third transistor having a gate and a drain connected to said first pump input and a source connected to said first output; and
    a fourth transistor having a gate and a drain connected to said second pump input and a source connected to said second output.

9. The apparatus according to claim 8, wherein said third and fourth transistors are sized in the range of 25% to 33% of the size of said first and second transistors.

10. The apparatus according to claim 8, wherein said one or more pump stage further comprises:
    a fifth transistor having a source connected to. said first output, a gate connected to said gate of said first transistor, and a drain and a well connected to (i) a well of said third transistor and a well of said fourth transistor of another one of said pump stages, (ii) a well of said first transistor and (iii) a well of said second transistor; and
    a sixth transistor having a source connected to said second output, a gate connected to said gate of said second transistor, and a drain and a well connected to (i) said well of said third transistor and said well of said fourth transistor of said another one of said pump stages, (ii) said well of said first transistor and (iii) said well of said second transistor.

11. The apparatus according to claim 10, wherein said fifth and sixth transistors are sized in the range of 20% to 40% of the size of said first and second transistors.

12. The apparatus according to claim 10, wherein said one or more pump stages further comprises:
    a deep well region;
    a seventh transistor having a source connected to said deep well region, a gate and a drain connected to said first pump input, and a well connected to the well of said first transistor; and
    an eighth transistor having a source connected to said deep well region, a gate and a drain connected to said second pump input, and a well connected to the well of said second transistor.

13. The apparatus according to claim 12, wherein said first, second, third, fourth, fifth, sixth, seventh and eighth transistors of each of said one or more pump stage comprises NMOS transistors.

14. The apparatus according to claim 13, wherein said apparatus further comprises a switch circuit configured to provide a bias signal to said deep well region of said one or more pump stages.

15. The apparatus according to claim 14, wherein:
    said deep well region is biased at a positive voltage level that is higher than a voltage level of said wells of said first, second, third, fourth, fifth, sixth, seventh, and eighth transistors.

16. The apparatus according to claim 6, wherein said last of said plurality of pump stages comprises:
    a first pump input coupled to (i) a second terminal of said first capacitor, (ii) a source of a first transistor, and (iii) said first output of a next to the last charge pump stage;
    a second pump input coupled to (i) a second terminal of said second capacitor, (ii) a source of a second transistor, and (iii) said second output of said next to the last charge pump stage;
    a first output coupled to a drain of said first transistor; and
    a second output coupled to a drain of said second transistor, wherein said first and second transistors are cross-coupled.

17. The apparatus according to claim 16, wherein said last stage further comprises:
    a third transistor coupled to said first pump input and said first output of said last charge pump stage;
    a fourth transistor coupled to said second pump input and said second output of said last charge pump stage; and
    an fifth transistor cross-coupled with a sixth transistor, wherein said fifth and sixth transistors are configured to generate a bias signal for wells of said first, second, third, and fourth transistors.

18. The apparatus of claim 17, wherein said first, second, third, fourth, fifth, and sixth transistors comprise PMOS transistors.

19. An apparatus for generating an output voltage having a greater magnitude than a supply voltage comprising:

means for generating (a) a positive high voltage at a first terminal when a first input has a first state and a second input has a second state and (b) a negative high voltage at a second terminal when said first input has said second state and said second input has said first state, wherein said generating means comprises a plurality of serially connected charge pump stages each comprising (i) a first capacitor configured to receive a first signal, (ii) a second capacitor configured to receive a second signal, (iii) a first pump input coupled to a drain of a first transistor, and (iv) a second pump input coupled to a drain of a second transistor.

20. A method for generating both a positive or a negative voltage having a greater magnitude than a supply voltage comprising the steps of:

(A) biasing a number of charge pump stages each comprising (i) a first capacitor configured to receive a first signal, (ii) a second capacitor configured to receive a second signal, (iii) a first pump input coupled to a drain of a first transistor, and (iv) a second pump input coupled to a drain of a second transistor;

(B) generating a positive high. voltage at a first terminal when a first input has a first state and a second input has a second state; and (C) generating a negative high voltage at a second terminal when said first input has said second state and said second input has said first state.

* * * * *